United States Patent
Ogawa et al.

(10) Patent No.: US 7,114,907 B2
(45) Date of Patent: Oct. 3, 2006

(54) TRANSFER ROBOT

(75) Inventors: Hironori Ogawa, Osaka (JP); Sakiko Uno, Osaka (JP)

(73) Assignee: Daihen Corporation, Osaka (JP)

( * ) Notice: Subject to any disclaimer, the term of this patent is extended or adjusted under 35 U.S.C. 154(b) by 12 days.

(21) Appl. No.: 10/999,307

(22) Filed: Nov. 29, 2004

(65) Prior Publication Data

US 2005/0118010 A1   Jun. 2, 2005

(30) Foreign Application Priority Data

Nov. 28, 2003   (JP) .............................. 2003-399684

(51) Int. Cl.
*B25J 18/02* (2006.01)
(52) U.S. Cl. ................. 414/744.5; 74/490.01; 901/15
(58) Field of Classification Search ............. 414/744.5, 414/744.8, 744.2, 744.3, 744.4; 901/15, 901/30, 31; 74/490.01

See application file for complete search history.

(56) References Cited

U.S. PATENT DOCUMENTS

| | | | | |
|---|---|---|---|---|
| 5,151,008 A | * | 9/1992 | Ishida et al. ............. | 414/744.5 |
| 6,305,898 B1 | * | 10/2001 | Yamagishi et al. ...... | 414/744.5 |
| 6,485,250 B1 | * | 11/2002 | Hofmeister ............... | 414/744.1 |

FOREIGN PATENT DOCUMENTS

| JP | 2002-531942 | 9/2002 |
|---|---|---|
| JP | 2003-142572 | 5/2003 |

* cited by examiner

*Primary Examiner*—Donald Underwood
(74) *Attorney, Agent, or Firm*—Hamre, Schumann, Mueller & Larson, P.C.

(57) ABSTRACT

A transfer robot includes a swivel base pivotable about a vertical axis, a hand for holding a plate-like work placed thereon, and a linear transfer mechanism supporting the hand and provided on the swivel base. The transfer mechanism is designed to move the hand forward and backward along a horizontal linear path. The hand is provided with a front stopper for checking a front edge of the work. The swivel base is provided with a work holder contacting a rear edge of the work when the hand is moved to a retracted position on the linear path.

10 Claims, 16 Drawing Sheets

TRANSFER ROBOT

BACKGROUND OF THE INVENTION

1. Field of the Invention

The present invention relates to a transfer robot. More specifically, the present invention relates to a transfer robot for transporting a thin plate-like work, such as a semiconductor wafer, along a straight path.

2. Description of the Related Art

Among many transfer robots, there is a group of transfer robots which have a mechanism for moving their hands along straight paths (linear transfer mechanism). These robots are simpler in construction and cheaper than the so-called jointed-arm robots, and are used widely in e.g. manufacturing process of semiconductor devices, for transportation of thin, plate-like works such as wafers into and out of different process chambers.

Such transfer robots are disclosed in JP-A-2002-531942 and JP-A-2003-142572, for example. The transfer robots disclosed in these documents generally have a basic construction as shown in FIG. 15 through FIG. 17 of the present application, in which hands 12 are supported via linear transfer mechanisms 11 on a swivel base 10 which is capable of pivoting as well as rising and lowering. More specifically, the transfer robot shown in FIG. 15 through FIG. 17 includes two linear transfer mechanisms 11 of a pivotal arm type. Each linear transfer mechanism 11 is provided with a hand 12 on which a thin, disc-like work W (wafers of silicon, for example) is placed. The two hands 12 supported by respective linear transfer mechanisms 11 overlap each other in plan view, and the two hands 12 are able to move on an identical path in plan view.

Basically, such a transfer robot is required to have a high level of precision for delivering the work W to a predetermined destination as well as for receiving the work W after it is processed. Further, when used in semiconductor manufacturing processes for example, the robot should be operable in a vacuum environment.

The transfer robot shown in FIG. 15 through FIG. 17 of the present application is also operable in the vacuum environment. The hand 12 is provided only with a plurality of regulating members 13 on which the work W can be placed. The regulating members surround the disc-like work W in order to prevent the work from shifting in horizontal directions. This construction is adopted for the hands of the transfer robots disclosed in the above-mentioned Japanese patent application documents. If the hand were provided with e.g. a movable clamp mechanism for enabling operation in the vacuum environment, the wiring and the actuator would become extremely complex in construction, and this would result in high cost and heavy weight for the products.

Such a transfer robot is installed as part of a vacuum transport module which operates between an atmospheric transport module and a plurality of process chambers. As shown in FIG. 18, a vacuum transport module 14 includes for example, a transport chamber 16 surrounded by process chambers 15, an atmospheric transport module 17, and loadlocks 18 connecting the atmospheric transport module 17 and the transport chambers 16 to each other. The transfer robot is placed in the transport chamber 16. The loadlocks 18 have a first door 18a to the atmospheric transport module, and a second door 18b to the transport chamber 16. When the first door 18a is opened and the second door 18b is closed, the inside space of the loadlock 18 becomes atmospheric for movement of works between the atmospheric transport module 17 and the loadlock 18 via the first door 18a. When the first door 18a is closed and the second door 18b is opened, the pressure in the inside space of the loadlock 18 becomes equal to the pressure in the transport chamber 16 (vacuum), for movement of works between the loadlock 18 and the transport chamber 16 via the second door 18b. Each process chamber 15 has a door 15a to the transport chamber 16, and opening the door 15a allows movement of works between the transport chamber 16 and the relevant process chamber 15.

In the vacuum transport module 14, the transfer robot extends the hand 12 to receive a work in the loadlock 18, then retracts the hand 12 into the transport chamber 16, and then turns the swivel base 10 to orient and extend the hand 12 to a desired process chamber 15 to deliver the work to the process chamber 15. Likewise, when receiving a processed work W from the process chambers 15, then transporting them to other process chambers 15 and returning them to the loadlock 18, the transfer robot uses combinations of these extending, retracting and turning operations of the hands 12.

As described above, the transfer robot uses extending, retracting and swiveling movements of the hands 12, with the works W placed thereon. In the above example, however, the works W are surrounded only by the regulating members 13 provided on the hands 12. Thus, in order to prevent the works W from falling off the hands 12 during the transportation, the speed of the hands 12 should be controlled during the operation so as not to become higher than a prescribed level. In particular, much care should be taken in swiveling the hands, since this operation can give rise to a strong centrifugal force. These limitations make it impossible to increase the transfer speed of the robot in moving the works W, thereby leading to a decrease in efficiency of semiconductor production. One idea to prevent the work from falling off during the transfer is to increase the height of the regulating members 13 of the hands 12. However, such an increase makes it necessary to increase raising-lowering stroke of the swivel base 10 or of the hands 12 for loading and unloading the works W. Further, if the two hands move on two respective paths which are identical as in plan view but spaced vertically as shown in FIG. 17, the two hands 12 must be spaced widely from each other. Unfavorably this leads to an increase in the raising-lowering stroke of the swivel base 10, and also to an increase in weight of the hands 12.

SUMMARY OF THE INVENTION

The present invention has been proposed under the circumstances described above. It is therefore an object of the present invention to provide a transfer robot capable of clamping a work to the hand with a simple arrangement using no special actuator.

In order to solve the problems, the present invention makes use of the following technical means.

Specifically, according to the present invention, there is provided a transfer robot comprising: a swivel base pivotable about a vertical axis; a hand for holding a plate-like work placed thereon; and a linear transfer mechanism supporting the hand and provided on the swivel base, the transfer mechanism designed to move the hand forward and backward along a horizontal linear path. The hand is provided with a front stopper for checking a front edge of the work. The swivel base is provided with a work holder contacting a rear edge of the work when the hand is moved to a retracted position on the linear path.

The linear transfer mechanism and the hand are pivotable about the swivel axis as the swivel base pivots. Also, the hand is movable in forward and rearward directions by the linear transfer mechanism. Thus, it is possible to transport the work by using combinations of such operations as receiving the work by advancing the hand, retracting the hand and swiveling the swivel base, and then delivering the work by advancing the hand.

When the work is placed on the hand and this hand retracts with the work carried thereon, the work is clamped from the forward and the rearward directions, between the stopper placed ahead of the work in the hand and the work holder which is behind the work on the swivel base. Since the work is clamped at the front and the rear, the work is not spun out off the hand by centrifugal force even if the swivel base is pivoted. This allows to increase the speed of swiveling operation of the swivel base, making it possible to transfer the work more quickly.

Preferably, the stopper on the hand may be fixed to the hand in a stationary manner, whereas the work holder may be elastically retractable from a natural state.

With such an arrangement, it is possible to reduce the impact from the work holder to the work when the hand retracts. Accordingly, the work is prevented from being damaged.

Preferably, the transfer robot of the present invention may further comprise an upright leaf spring having an upper end and a lower end, wherein the upper end is connected to the work holder, while the lower end is connected to the swivel base. The leaf spring may have a longitudinal axis, as viewed in horizontal cross section, which is perpendicular to the linear path of the hand.

The leaf spring is weaker in rigidity in the hand transfer direction, but stronger in a direction perpendicular to the hand transfer direction. Thus, the work holder can make an elastic contact with the work when the work is clamped by the stopper and the work holder. This leads to stable elastic holding of the work.

Preferably, the stopper on the hand may be elastically movable in a forward direction from a natural state, while the work holder may be provided in a stationary manner.

According to this embodiment again, the impact from the work holder to the work when the hand retracts is reduced by the elastic advancement of the stopper on the hand.

Preferably, the hand may further be provided with a stationary rear stopper for checking a rear edge of the work.

With this arrangement, the rearward shift of the work carried on the hand is checked by the rear stopper which is placed behind the work. Therefore, it is possible to prevent the work from falling off while the hand is moving in the rearward direction.

Preferably, the rear stopper may comprise two stopping members spaced from each other in a width direction of the hand. Between these stopping members, the hand is formed with a cutout which the work holder is allowed to enter.

Preferably, the hand may be configured to hold a circular plate-like work.

Preferably, the transfer robot of the present invention may further comprise a second set similar to a first set made up of the linear transfer mechanism, the hand, the stopper and the work holder. The first set and the second set may be point-symmetrical with respect to the swivel axis. The linear path of the hand in the first set and the other linear path of the hand in the second set may be in line.

This arrangement makes it possible to perform efficient work transfer operation in a manner such that one hand receives a processed work from one process chamber, while the other hand delivers a different work to the process chamber for another cycle of process.

As described above, the transfer robot according to the present invention uses no special actuators, and the work is clamped by the movement of the hands. The transfer robot according to the present invention is simple in construction and there is no problem in operation in vacuum environment.

Other features and advantages of the present invention will become clearer from the following description to be made with reference to the drawings.

DETAILED DESCRIPTION OF THE PREFERRED EMBODIMENTS

Figure 1:
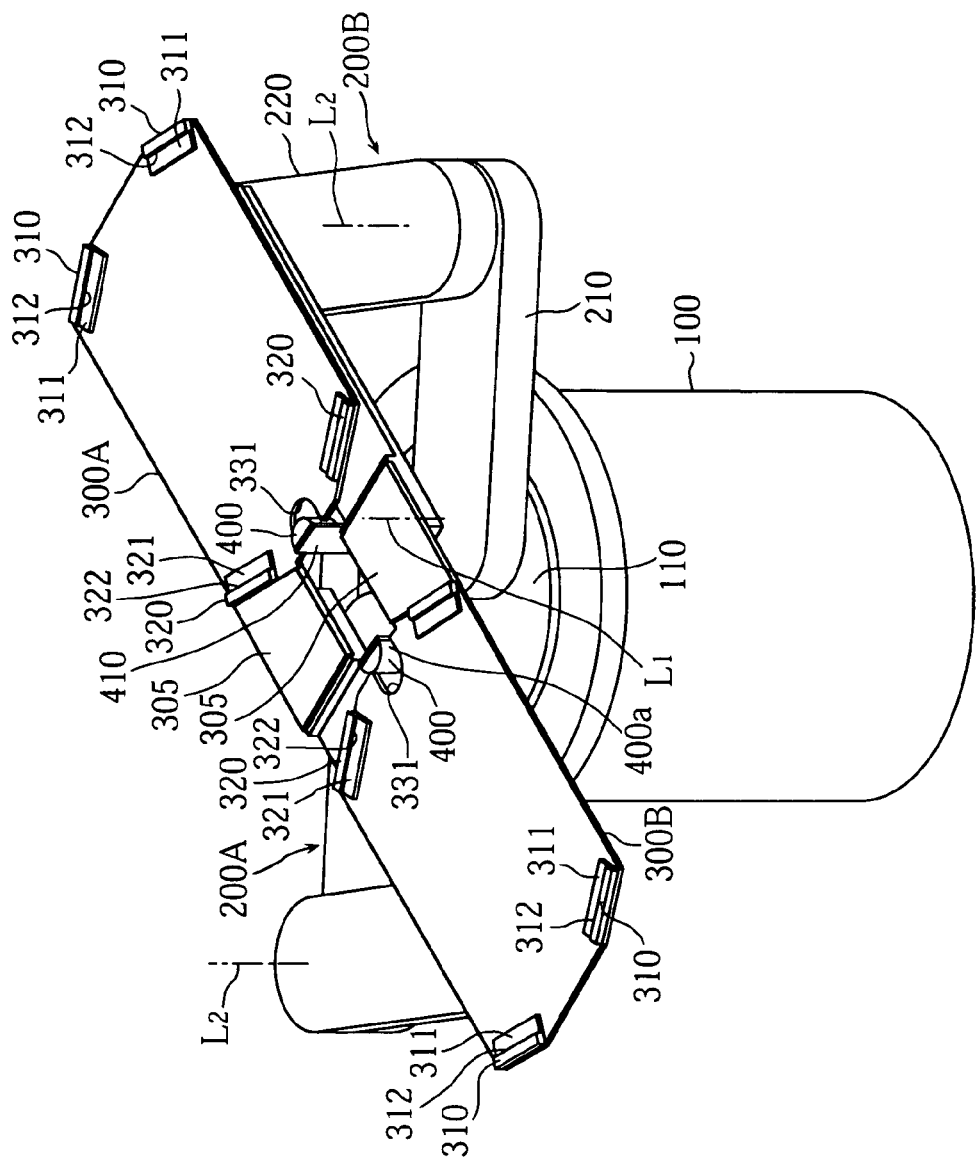
FIG. 1 is an overall perspective view of a transfer robot as a first embodiment of the present invention, shown with both hands retracted.

Preferred embodiments of the present invention will be described below with reference to FIG. 1 through FIG. 14.

FIG. 1 through FIG. 9 show a transfer robot according to a first embodiment of the present invention. As seen from FIG. 1, FIG. 2 and FIG. 5 in particular, the transfer robot includes a cylindrical base 100, a swivel base 110 which is incorporated in the cylindrical base 100 and is pivotable about a vertical swivel axis $L_0$, a pair of linear transfer mechanisms 200A, 200B mounted on the swivel base 110, and hands 300A, 300B which are supported by the linear transfer mechanisms 200A, 200B respectively.

Each of the linear transfer mechanisms 200A, 200B includes a first arm 210 which is pivotable with respect to the swivel base 110 about a vertical first axis $L_1$, a second arm 220 which is pivotable about a second axis $L_2$ that is vertical with respect to a tip of the first arm 210. The second arm 220 has a tip provided with a bracket 305 which is pivotable about a vertical, third axis $L_3$ relatively to the second arm of a corresponding one of the hands 300A, 300B. In the linear transfer mechanisms 200A, 200B, the distance between the first axis $L_1$ and the second axis $L_2$ is equal to the distance between the second axis $L_2$ and the third axis $L_3$. Further, the first arm 210 and the second arm 220 are so connected to each other that when the first arm 210 is pivoted about the first axis $L_1$, the line segment which is defined by the first axis $L_1$ and the third axis $L_3$ is always in a predetermined line, providing a base for an isosceles triangle whose apex is at the second axis $L_2$. Further, the bracket 305 and the second arm 220 are connected to each other in a manner such that the hands 300A, 300B are always oriented in a predetermined direction regardless of deformation of the isosceles triangle.

Figure 7:
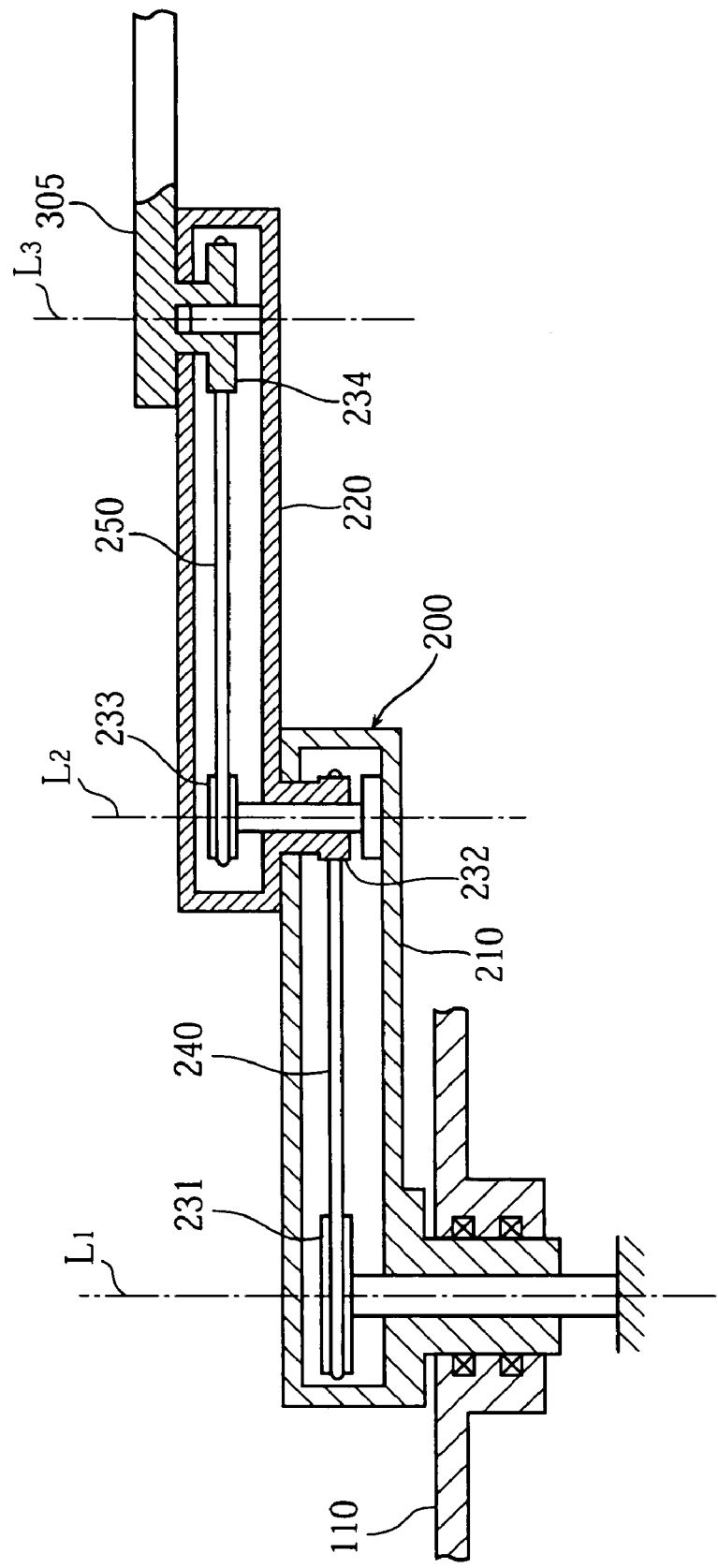
FIG. 7 is a sectional view, showing an internal construction of a linear transfer mechanism.
Figure 8:
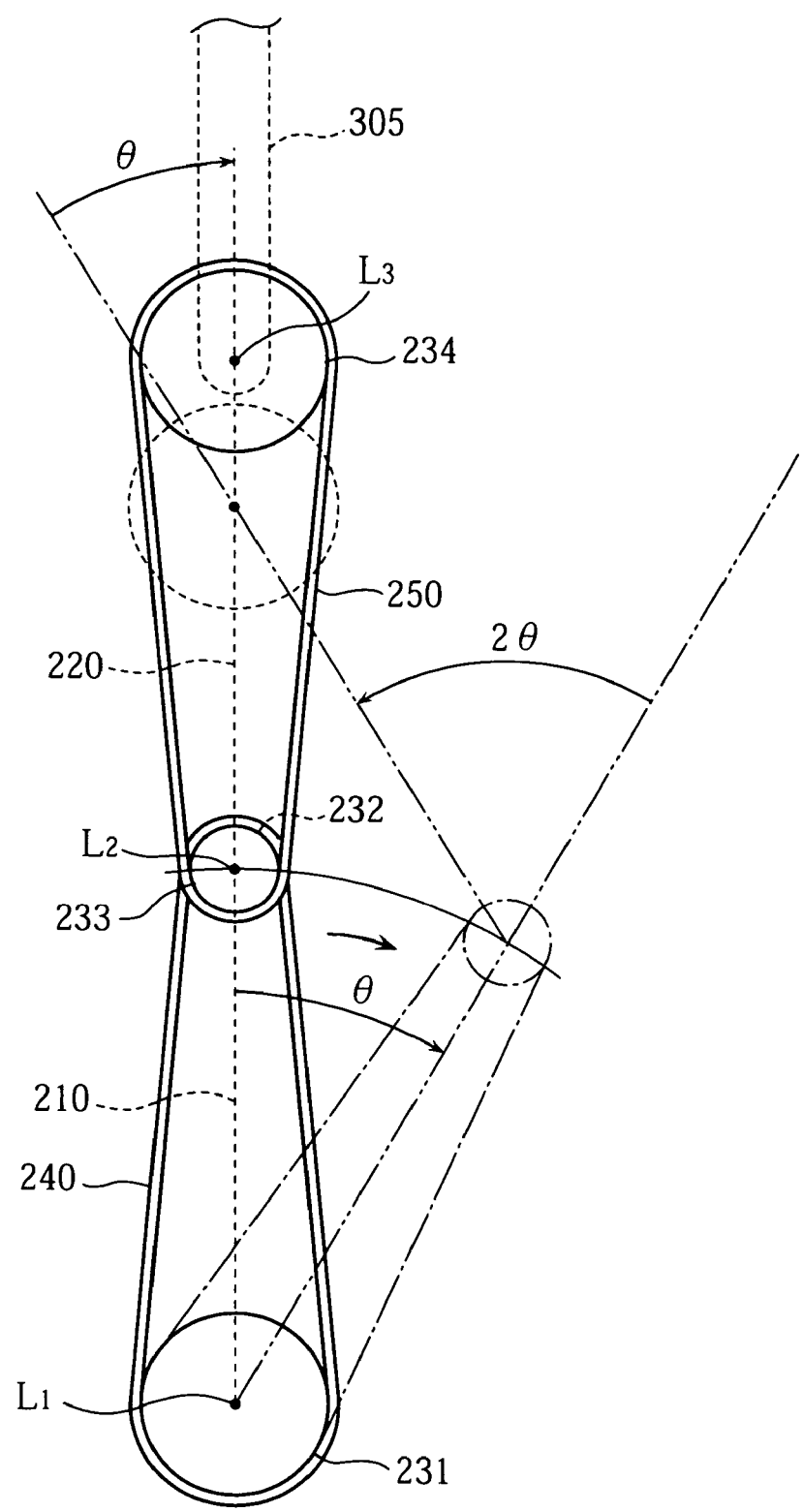
FIG. 8 is a diagram illustrating a function of the linear transfer mechanism in FIG. 7.

FIG. 7 and FIG. 8 schematically show how the first arm 210, the second arm 220 and the bracket 305 are connected to each other. The swivel base 110 supports the first arm 210 pivotably about the first axis $L_1$. The first arm 210 incorporates a first pulley 231 which is fixed to the swivel base 110 and rotatable about the first axis $L_1$. The second arm 220 is connected to the top of the first arm 210 so as to pivot about the second axis relatively to the first arm 210. To this second arm 220, a second pulley 232 is connected which is fixed to the second arm 220 and rotatable about the second axis $L_1$. The second pulley 232 has a diameter which is half the diameter of the first pulley 231. The first pulley 231 and the second pulley 232 are connected to each other by an endless belt 240 incorporated in the first arm 210. On the other hand, the second arm 220 is provided with a third pulley 233 which is fixed to the first arm 210 and rotatable about the second axis $L_2$. The bracket 305 is connected at the tip of second arm 220 so as to pivot about the third axis $L_3$ relatively to the second arm 220. To this bracket 305, a fourth pulley 234 is connected which is fixed to the bracket 305 and rotatable about the third axis $L_3$. The fourth pulley 234 has a diameter which is twice the diameter of the third pulley 233. The third pulley 233 and the fourth pulley 234 are connected to each other by an endless belt 250 incorporated in the second arm 220.

Referring to FIG. 8, suppose that the first arm 210 pivots clockwise about the first axis $L_1$ by an angle θ. Since the second pulley 232 has a diameter which is half the diameter of the first pulley 231, the second arm 220 pivots counterclockwise with respect to the first arm 210 about the second axis $L_2$ by an angle 2θ. As previously described, the distance between the first axis $L_1$ and the second axis $L_2$ (the length of the first arm 210) is equal to the distance between the second axis $L_2$ and the third axis $L_3$ (the length of the second arm 220). Therefore, when the first arm 210 pivots about the first axis $L_1$, the first arm 210 and the second arm 220 always represent oblique sides of an isosceles triangle whose base is provided by a line segment that if defined by the first axis $L_1$ and the third axis $L_3$ which moves on a predetermined line. This means that the third axis $L_3$ always moves on a predetermined straight line which passes the first axis $L_1$ as the first arm 210 pivots. Further, since the fourth pulley 234 has a diameter which is twice the diameter of the third pulley 233. Therefore, when the second arm 220 pivots counterclockwise with respect to the first arm 210 about the second axis $L_2$ by an angle 2θ, the bracket 305 pivots clockwise with respect to the second arm 220 about the third axis $L_3$ by an angle θ. As described above, the second arm 220 pivots counterclockwise with respect to the first arm 210 about the second axis $L_2$ by an angle 2θ, but this pivotal movement is offset by the clockwise pivotal movement of the first arm 210 about the first axis $L_1$ by the angle θ and the clockwise pivotal movement of the bracket 305 about the third axis $L_3$ by the angle θ. As a result, the absolute orientation of the bracket 305 with respect to the swivel base 110 is constant regardless of the above-described deformation of the first arm 210 and the second arm 220.

Figure 2:
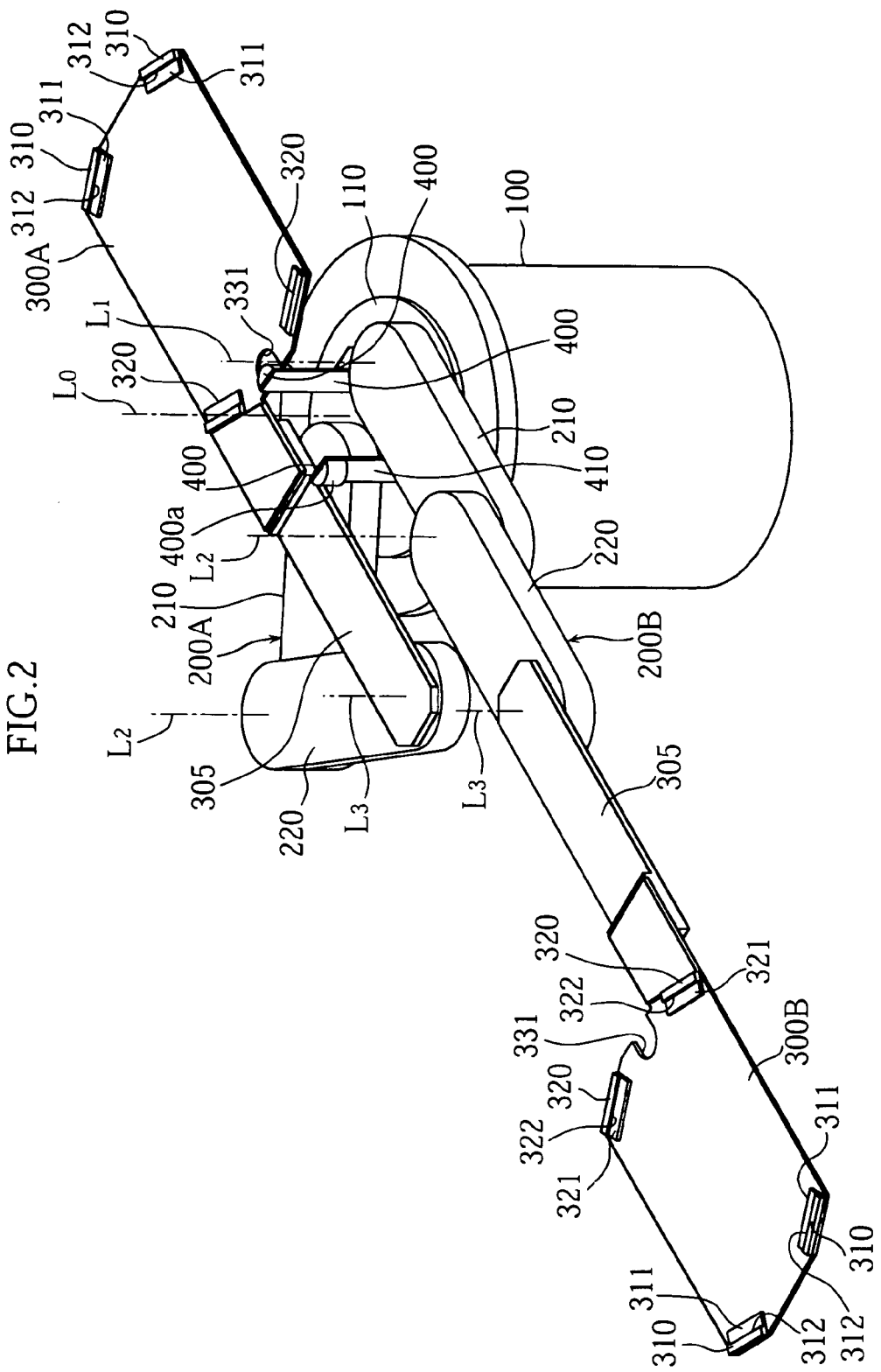
FIG. 2 is an overall perspective view of the transfer robot as the first embodiment of the present invention, shown with one of the hands extended.
Figure 3:
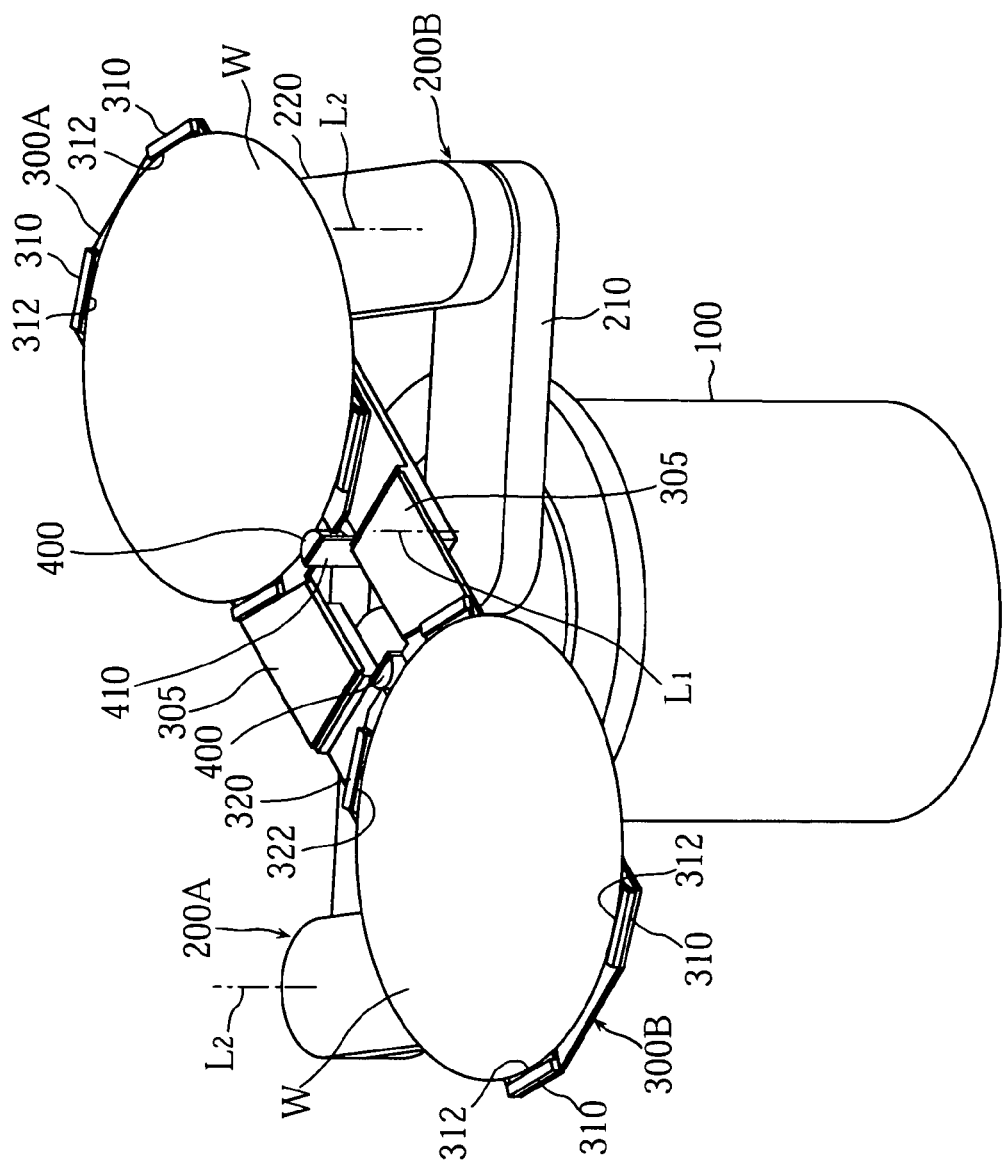
FIG. 3 is an overall perspective view of the transfer robot as the first embodiment of the present invention, shown with each hand retracted and loaded with a work.
Figure 4:
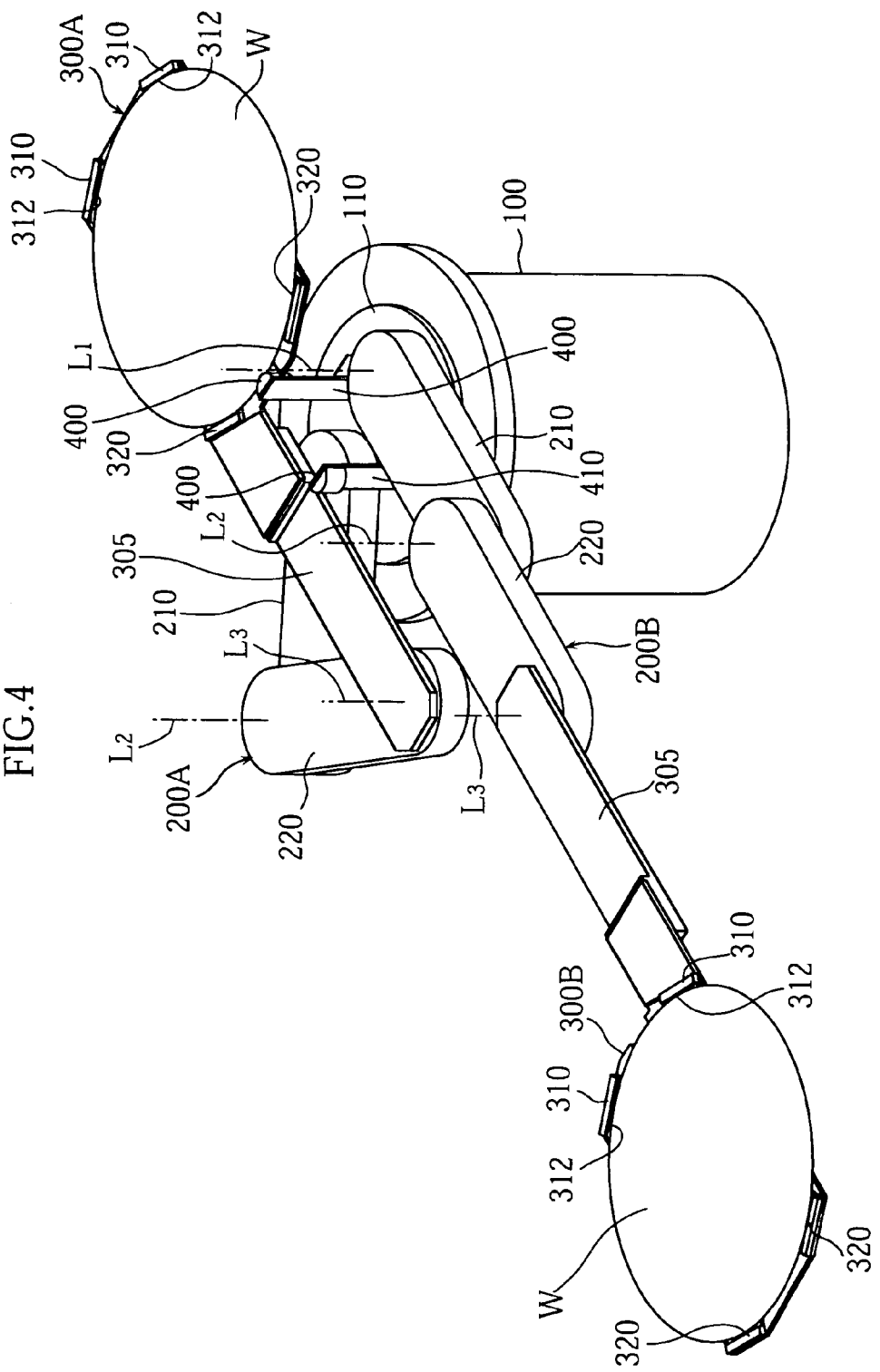
FIG. 4 is an overall perspective view of the transfer robot as the first embodiment of the present invention, shown with each hand loaded with a work and one of the hands extended.
Figure 5:
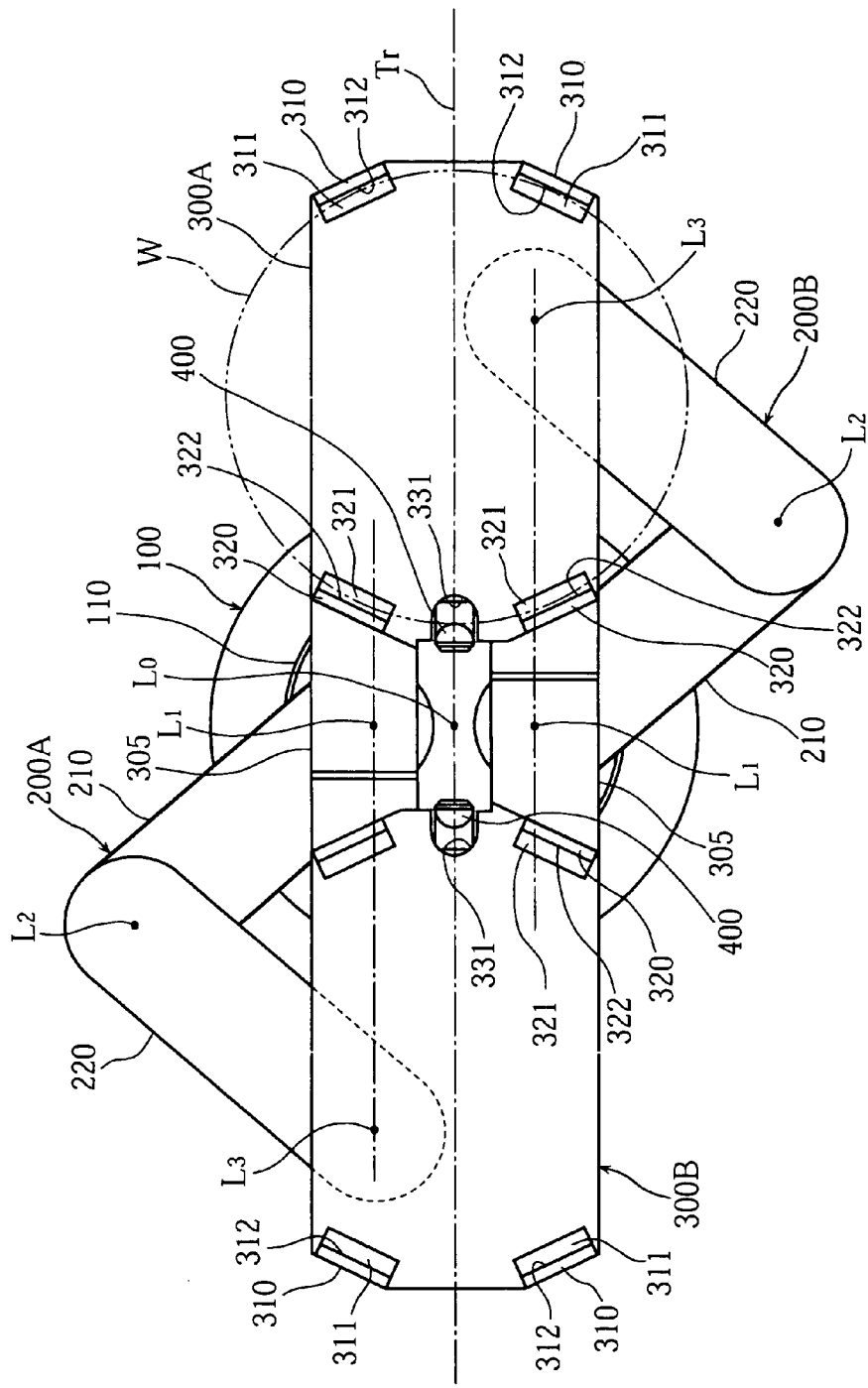
FIG. 5 is a plan view of the transfer robot as shown in FIG. 1.

As shown clearly in FIG. 1, FIG. 3 and FIG. 5, the pair of linear transfer mechanisms 200A, 200B are point symmetric to each other with respect to a swivel axis $L_0$ of the swivel base 110. Further, the first axis L1 (the pivotal center of the first arm 210) and the third axis $L_3$ (the pivotal center of the bracket 305 with respect to the second arm 210) are spaced by a predetermined distance and parallel to each other. Each of the linear transfer mechanisms 200A, 200B is movable to a position in which the hand 300A is retracted as represented by the first linear transfer mechanism 200A in FIG. 2, FIG. 4 and FIG. 6, as well as to a position in which the hand 300B is extended as represented by the second linear transfer mechanism 200B. The linear transfer mechanisms 200A, 200B are driven by an unillustrated rotating actuator incorporated in the swivel base 110, by pivoting a corresponding one of the first arms 210 about the first axis L1. The swivel base 110 is pivotable about the swivel axis $L_0$ by an unillustrated rotating actuator incorporated in the base, as well as capable of being raised and lowered by an unillustrated lifting actuator.

The brackets 305 which support the hand 300A, 300B are provided by a horizontal plate-like member of a predetermined width, extending generally along the line connecting the first axis $L_1$ and the third axis $L_3$, and is formed to extend from the third axis $L_3$, overhanging the first axis $L_1$ when the linear transfer mechanisms 200A, 200B are at their retracted positions. As described above, the two lines each defined by the first axis $L_1$ and the third axis $L_3$ in each of the linear transfer mechanisms 200A, 200B are spaced by a predetermined distance and parallel to each other. Therefore, there is no interference between the two brackets 305 during the above-described deformation of the linear transfer mechanisms 200A, 200B between the extended position and the retracted position. Each of the hands 300A, 300B is a plate-like horizontal member attached to the tip of corresponding bracket 305 in such a way that the hand has its centerline being along the linear transport path Tr or parallel to a line which passes the first axis $L_1$ and the third axis $L_3$ of the corresponding linear transfer mechanism 200A, 200B. For this reason, as shown in e.g. FIG. 5, each bracket 305 has its tip connected to an off-centered end of the corresponding hands 300A, 300B shifted in the right or left direction. Each of the hands 300A, 300B is above the corresponding bracket 305. For this reason, when both of the linear transfer mechanisms 200A, 200B are at their retracted position, one hand 300A supported by the corresponding transfer mechanism 200A overlaps the bracket 305 of the other linear transfer mechanism 200B. Accordingly, there is no interference between the hand 300A of the linear transfer mechanism 200A and the bracket 305 of the other linear transfer mechanism 200B, when the linear transfer mechanisms 200A, 200B deform between the extended position and the retracted position. For these reasons, it is possible to increase the transport distance of the hands 300A, 300B to a maximum possible extent.

Each of the hands 300A, 300B is provided with four stoppers 312, 322 which make contact with the perimeter of the work W such as a wafer, to check horizontal shift of the work W. Each of the stoppers 312, 322 is fixed to the hands 300A, 300B in an on movable (nondeflective) manner. In the embodiment shown in the figure, these stoppers 312, 322 are provided by plate-like block members 310, 320 which have table surfaces 311, 321 for supporting a lower peripheral surface of the wafer, and stopper surfaces 312, 322 raised vertically from the table surfaces 311, 321. In the illustrated embodiment, each of the hands 300A, 300B is provided with a total of four block members 310, 320, two of which are provided on the front side of each hand, and the other two are provided on the rear side. The stopper surfaces 312 of the two block members 310 on the front side can check forward shift of the work W, while the stopper surfaces 322 of the two block members 320 on the rear side can check rearward shift of the work w. The stopper surfaces 312, 322 are straight edges as in plan view, and are so positioned that the work W, which is a thin disc, is accommodated with appropriate play.

Each of the hands 300A, 300B has a rear edge between the two rear block members 320, where a U-shaped cutout 331 is formed. The U-shaped cutout 331 is so deep that it overlaps a circle inscribed to the stopper surfaces 312, 322 of the block members 310, 320.

Figure 9:
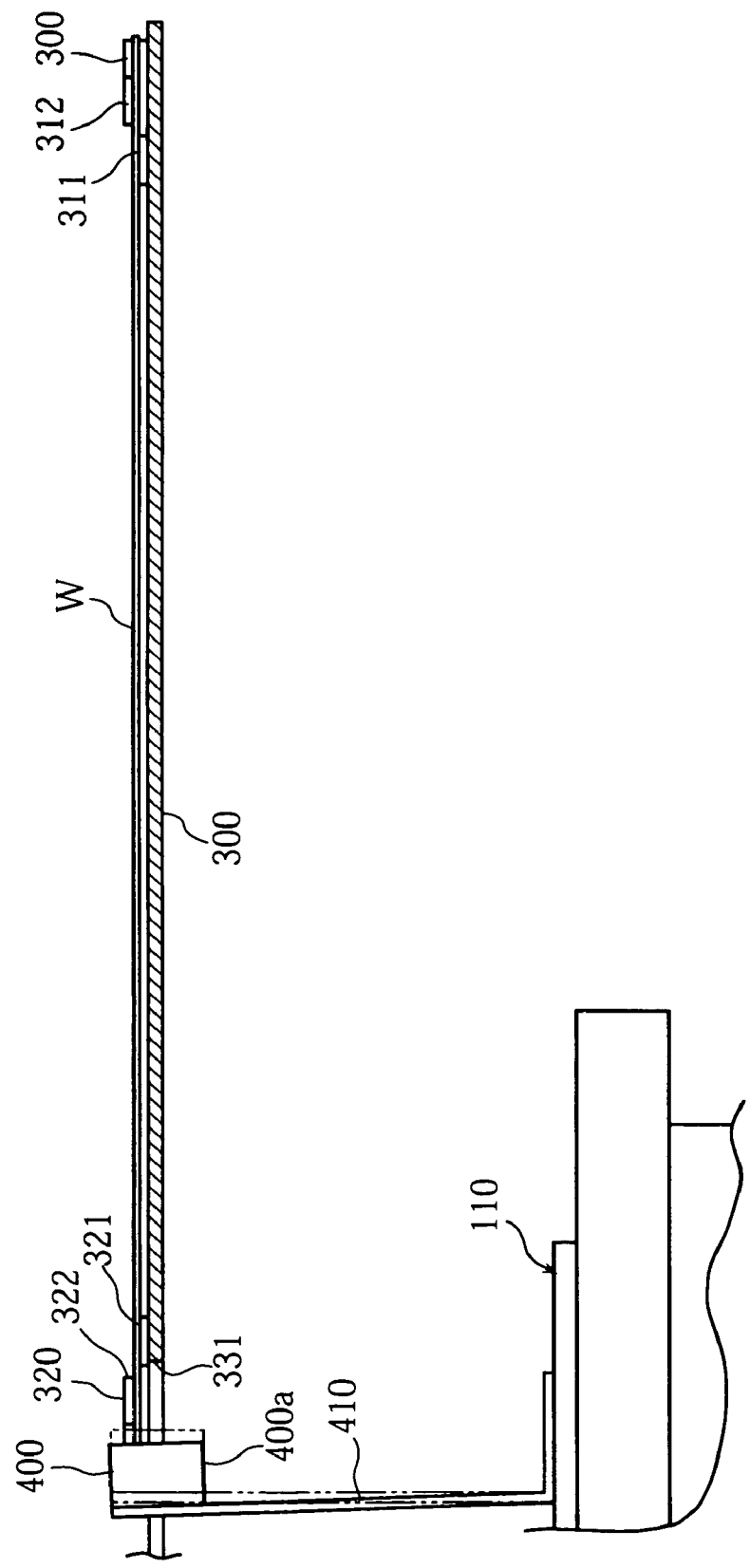
FIG. 9 is a diagram illustrating a function of a work holder in the transfer robot.

As shown clearly in FIG. 2 and FIG. 9, the swivel base 110 is provided with work holders 400 each supported at an upper end of a leaf spring 410 which has a lower end connected to the swivel base 110. The leaf spring 410 has a longitudinal axis, as viewed in horizontal cross section, which extends perpendicularly to the horizontal transport path. The leaf spring 410 is weak in rigidity in the forward-rearward direction of the hands 300A, 300B, but strong in the widthwise direction. The work holder 400 is placed at a height corresponding to the height of the hands 300A, 300B, and provided by a resin member 400a as an upright columnar contact surface attached to a front-facing surface of the leaf spring 410. With this arrangement, the work holder 400 is capable of being displaced easily and elastically by an external force exerted from the forward-rearward directions. It should be noted here that the work holder 400 has a width matched with the width of the cutout 311, so as to come into the cutout 311 when the corresponding hand 300A, 300B are at their retracted position.

As described above, each of the hands 300A, 300B is operated by the corresponding linear transfer mechanisms 200A, 200B, on the linear transport path Tr in the forward and rearward directions, and is capable of coming to the extended position and the retracted position. Normally, when both of the hands 300A, 300B assume the retracted position, the swivel base 110 is pivoted to orient the hands 300A, 300B in desired directions. When a work W is transported by this transfer robot, one of the hands 300A, 300B is oriented to a loading place for example around the robot, and then the appropriate one of the hands 300A, 300B is extended to receive the work from the loading place. The appropriate one of the hands 300A, 300B which has received the work W is then retracted, and the swivel base 110 is pivoted to orient this particular one of the hands 300A, 300B in the unloading place. Then, this particular one of the hands 300A, 300B is extended to deliver the work W to the unloading place.

Figure 6:
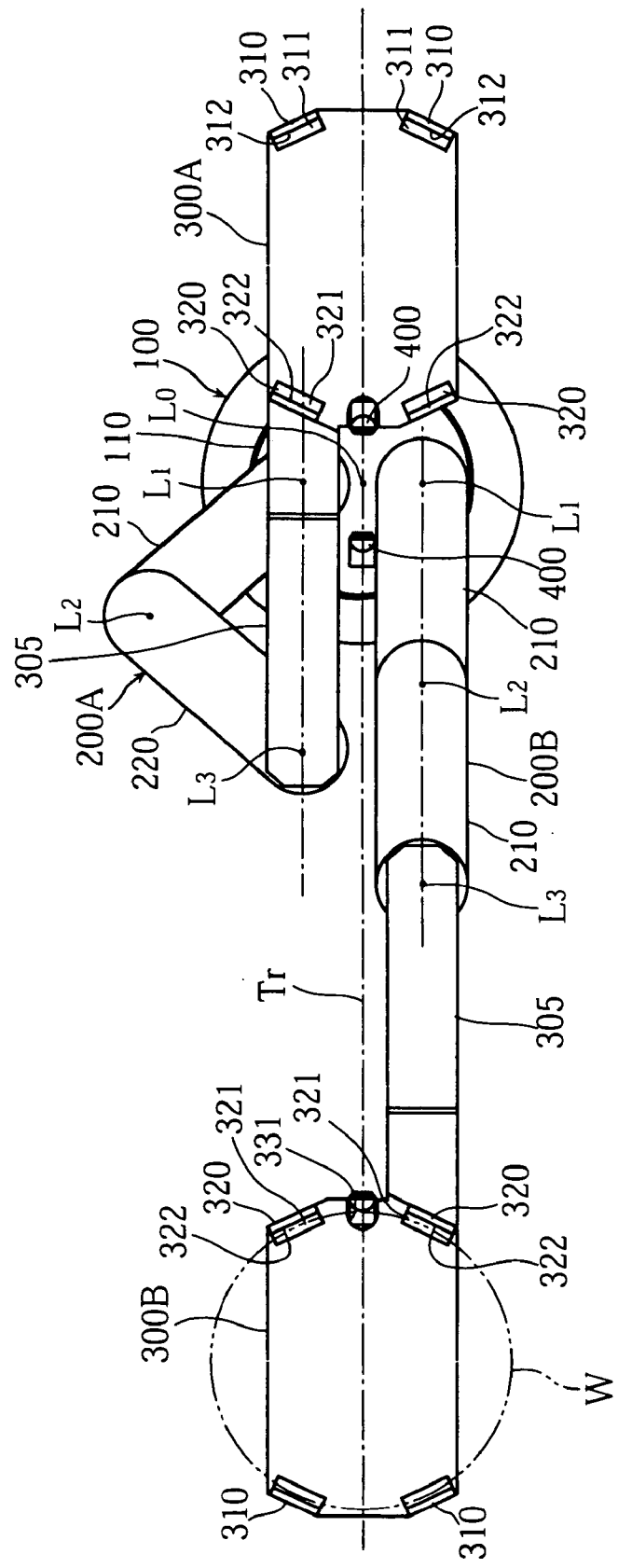
FIG. 6 is a plan view of the transfer robot as shown in FIG. 2.

When the work W is received, as shown clearly in e.g. FIG. 5 and FIG. 6, the lower surface edge of the work W is supported by the table surfaces 311, 321 of the four block members, while the stopper surfaces 312, 322 of the four block members 310, 320 check horizontal shift of the work W on the hands 300A, 300B. Since the four block members 310, 320 are at the front and the rear of the work W, the shift of the work W in the forward and the rearward directions is properly checked. Thus, the work W does not drop off the hands 300A, 300B even if the forward-rearward movement of the hands 300A, 300B is quick.

As shown clearly in FIG. 3, FIG. 5 and FIG. 9, when the hands 300A, 300B retract, with the works W placed thereon, the work holders 400 finally come into respective cutouts 331, to contact rear edges of the works W respectively. In this state, each work W is elastically clamped by the two stoppers 312 of the front block members 310 and the work holder 400 at the rear. Since the work holder 400 is supported by the leaf spring 410, the work W is protected from excessive impact, and therefore is not damaged. Therefore, even if the swivel base 110 is pivoted quickly when the hands 300A, 300B are in the retracted position, the works W are not centrifugally spun out.

As a result, it is possible to increase the transfer speed of the work W in the above-described operation, and increase processing efficiency of the work W in e.g. semiconductor processing. Further, since no special actuators are used, and the work W is clamped by using the forward-rearward movement of the hands 300A, 300B, construction can be simple and there is no problem in operation in vacuum environment.

Further, according to the above embodiment, a pair of linear transfer mechanisms 200A, 200B are disposed in a point symmetry with respect to the swivel axis $L_0$ of the swivel base 110. This makes possible such an efficient work transport operation that upon reception of a processed work W from a predetermined process chamber by one of the hands 300A, the swivel base 110 is pivoted by 180 degrees so a work W held by the other hand 300B is delivered into the process chamber for the next cycle of process.

Figure 10:
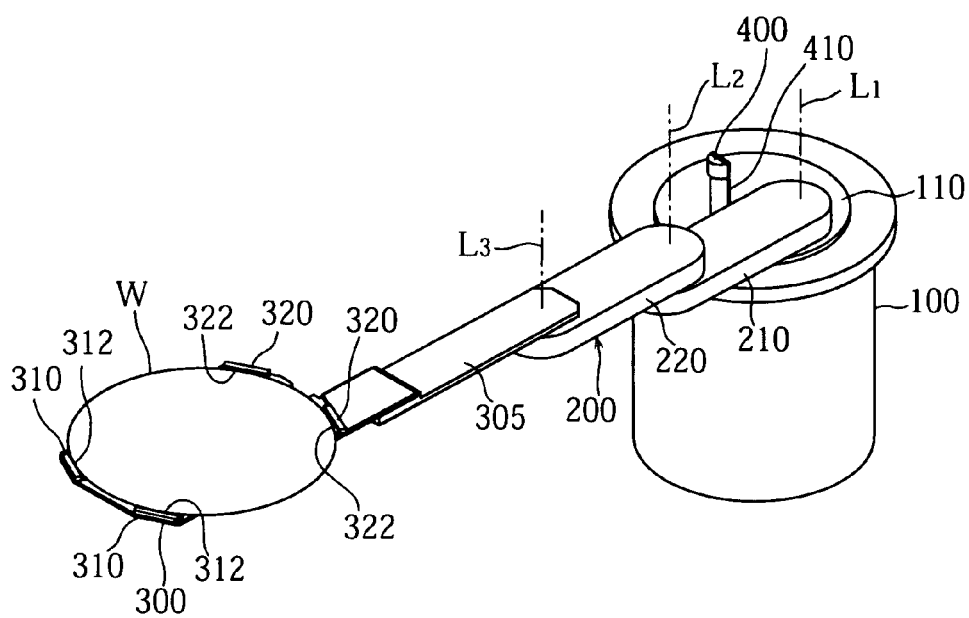
FIG. 10 is an overall perspective view of a transfer robot as a second embodiment of the present invention, shown with a hand extended and loaded with a work.
Figure 11:
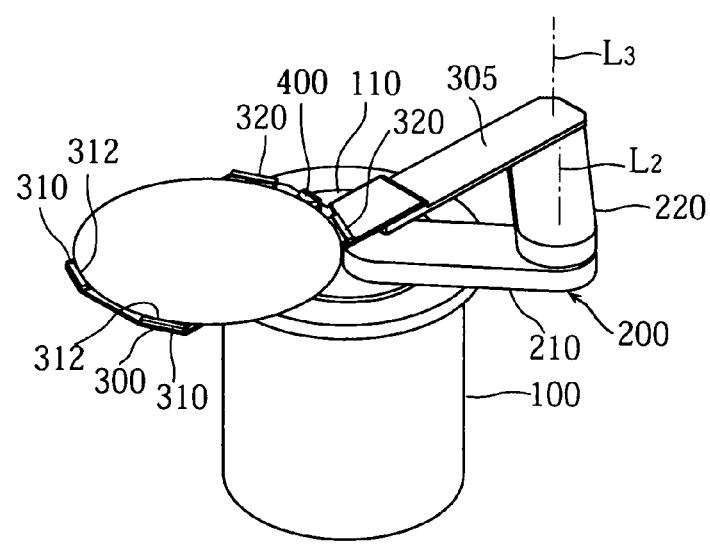
FIG. 11 is an overall perspective view of the transfer robot as the second embodiment of the present invention, shown with the hand retracted and loaded with the work.

FIG. 10 and FIG. 11 show a transfer robot according to a second embodiment of the present invention. In this embodiment, a swivel base 110 has one linear transfer mechanism 200. An arrangement utilizing the linear transfer mechanisms 200, a hand 300 supported thereby, and a work holder 400 provided in the swivel base 110 is essentially the same as in the first embodiment which involves a single set of the linear transfer mechanism 200A, the hand 300A and the work holder 400. Thus, identical members and parts are indicated by the same reference characters, and explanation about them are not repeated. This embodiment offers the same advantages as offered by the first embodiment.

Figure 12:
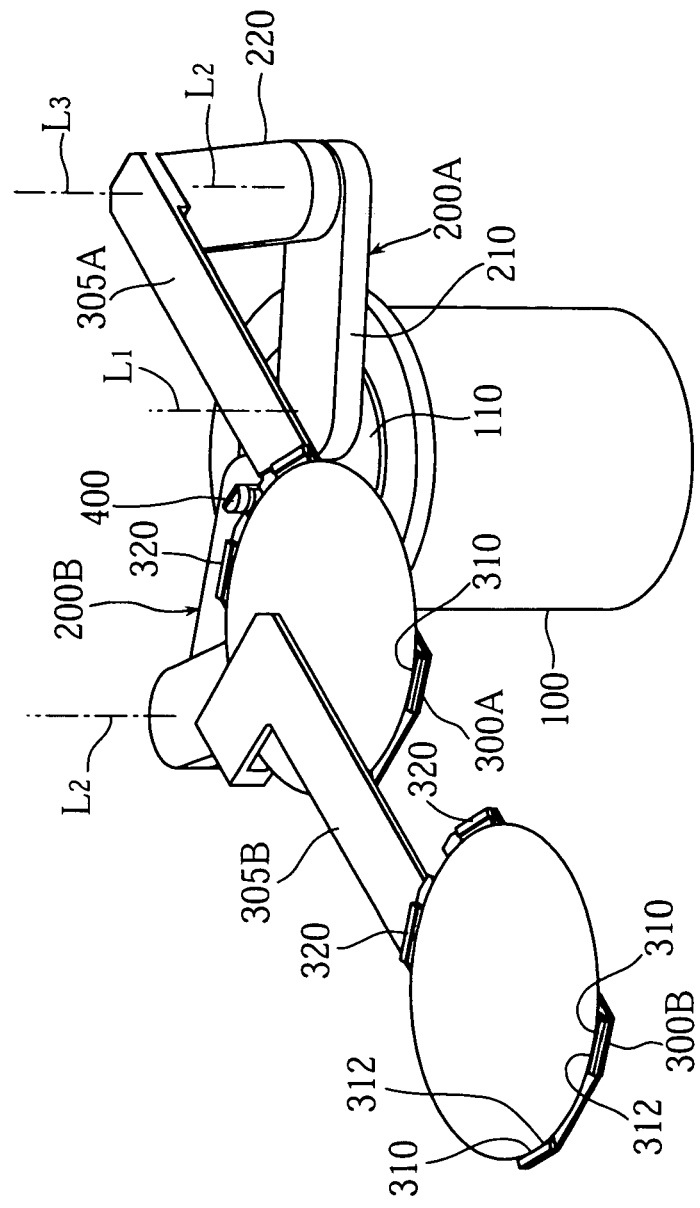
FIG. 12 is an overall perspective view of a transfer robot as a third embodiment of the present invention, shown with both hands loaded with a work, one of the hands extended while the other retracted.
Figure 13:
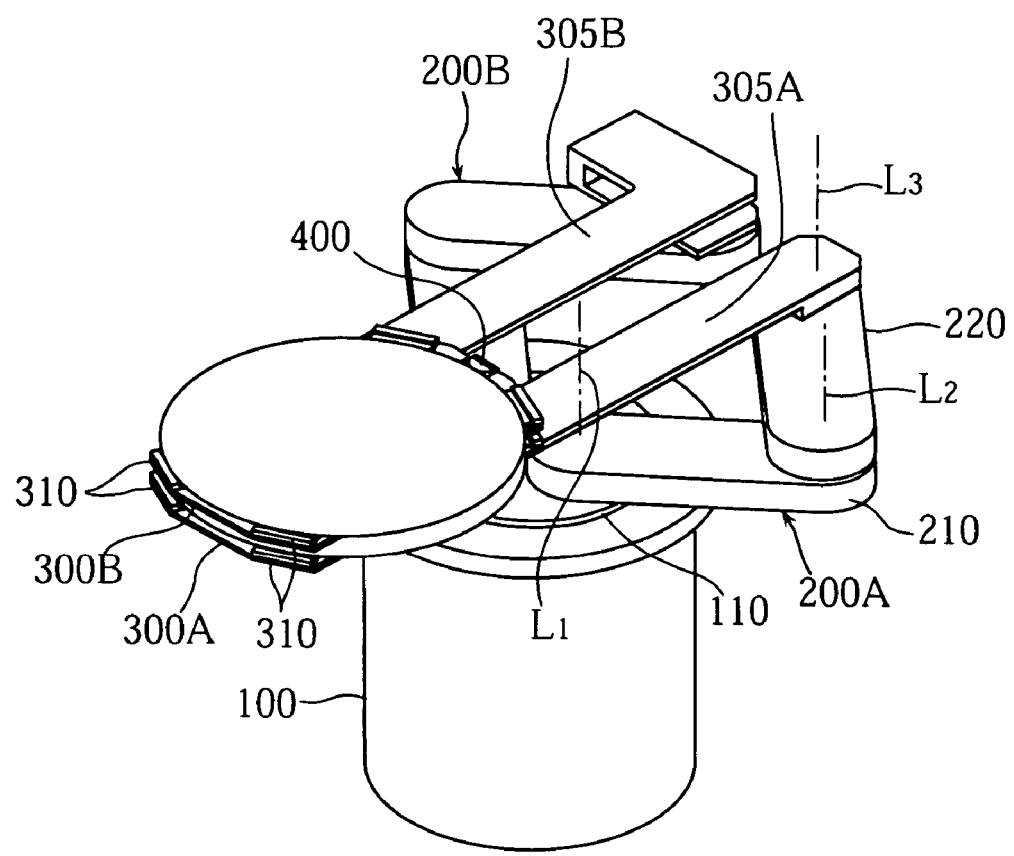
FIG. 13 is an overall perspective view of the transfer robot as the third embodiment of the present invention, shown with both hand loaded with the works and retracted.

FIG. 12 and FIG. 13 show a transfer robot according to a third embodiment of the present invention. In this embodiment, a swivel base 110 has a pair of linear transfer mechanisms 200A, 200B. However, this pair of linear transfer mechanisms 200A, 200B are mirror symmetric with each other. The linear transfer mechanisms 200A, 200B may be of the same construction as in the first embodiment. FIG. 13 shows both of the linear transfer mechanisms 200A, 200B at their retracted position. As understood from this figure, brackets 305A, 305B are supported at respective tips of second arms 220 as part of the respective linear transfer mechanisms 200A, 200B, overhanging their respective first axis $L_1$. Note, however, that one bracket 305A is platy and horizontal, while the other bracket 305B is shaped like a U which is turned down, in order to avoid interference with the other hand 300A attached to the tip of the bracket 305A nor with the work W placed thereon. With this construction the bracket 305B is above and ahead of the bracket 305A. With this, the bracket 305B has its tip connected to the hand 300B above the hand 300A which is connected to the other bracket 305A. Both brackets 305A, 305B are spaced from each other in the right and left directions in plan view, yet both hands 300A, 300B moves on the same transport path in plan view. Specifically, one bracket 305A has its tip connected at an off-centered end of the hand 300A shifted to the left, whereas the other bracket 305B has its tip connected at an off-centered end of the hand 300B shifted to the right.

Each of the hands 300A, 300B has, as described in the first embodiment, four block members 310, 320 which have stopper surfaces 312, 322. Further, the swivel base 110 supports, via a leaf spring (not illustrated), a work holder 400 which is capable of making elastic contact with a rear end edge of both works W placed on the hands 300A, 300B.

According to this embodiment again, the same advantages as offered by the first embodiment can be enjoyed. Specifically, for example, when the hands 300A retract with the works W held thereon, each work W is elastically clamped by the stoppers 312 at the front and the work holder 400 at the rear, and therefore it is possible to pivot the swivel base 110 quickly without dropping the works W. It should be noted here that according to the present embodiment, both hands 300A, 300B can extend and retract in the same directions. This makes possible such a work transport operation of a higher efficiency that upon taking out a processed work W from a predetermined process chamber by one hand 300A, a work W held by the other hand 300B is delivered into the process chamber for the next cycle of process, without pivoting the swivel base 110.

Figure 14:
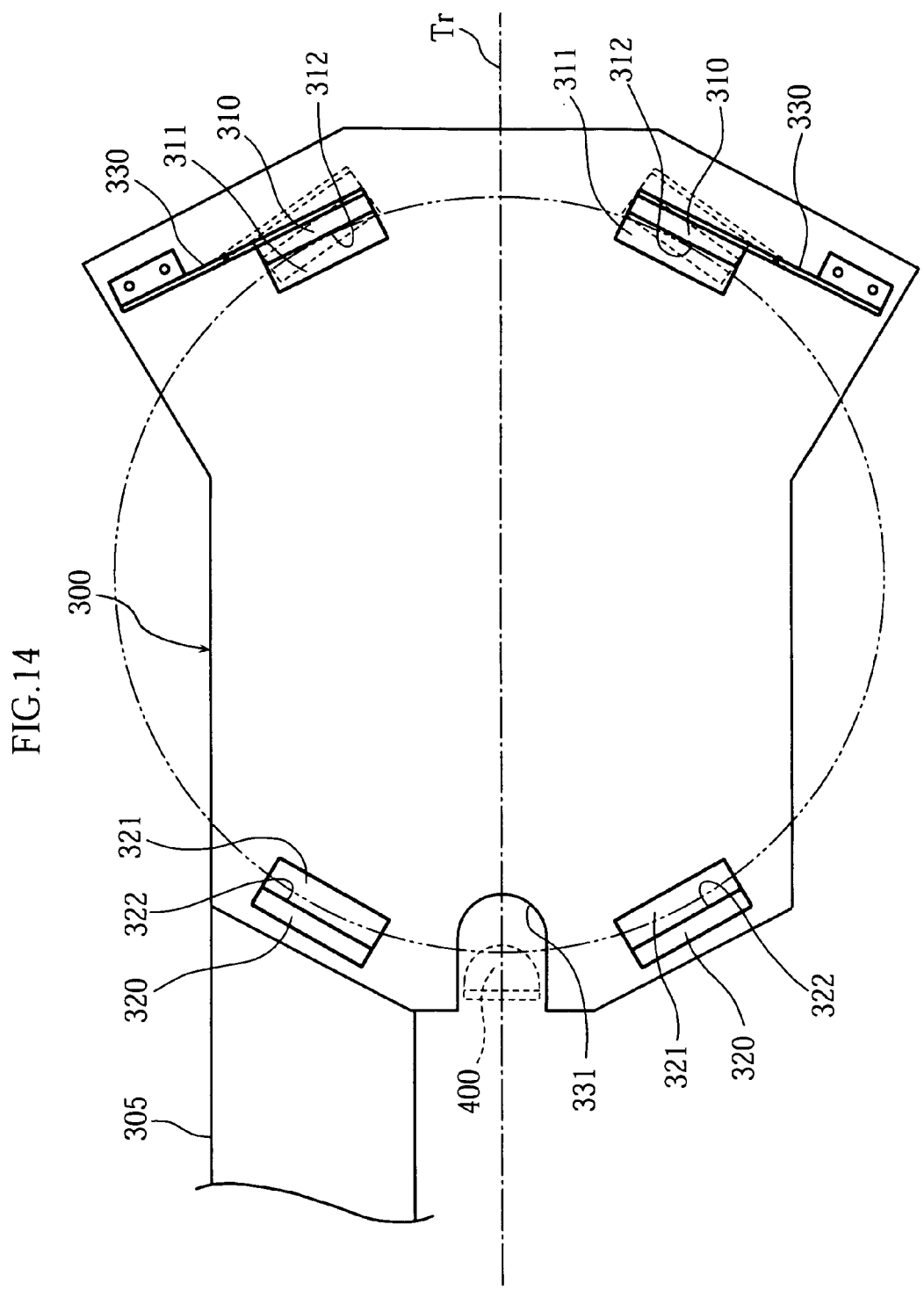
FIG. 14 is a plan view of another hand which is applicable to the transfer robot according to the present invention.
Figure 15:
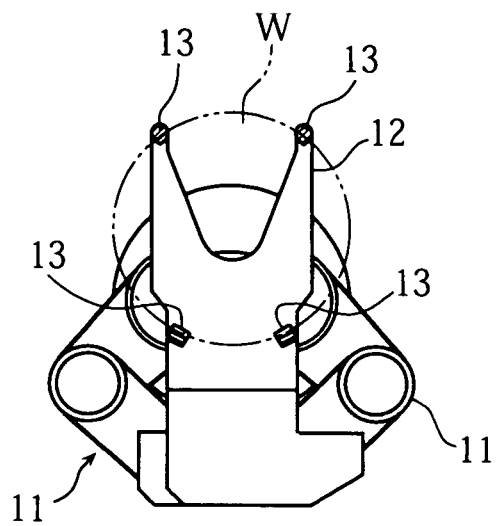
FIG. 15 is a plan view of a conventional transfer robot, with both hands retracted.
Figure 16:
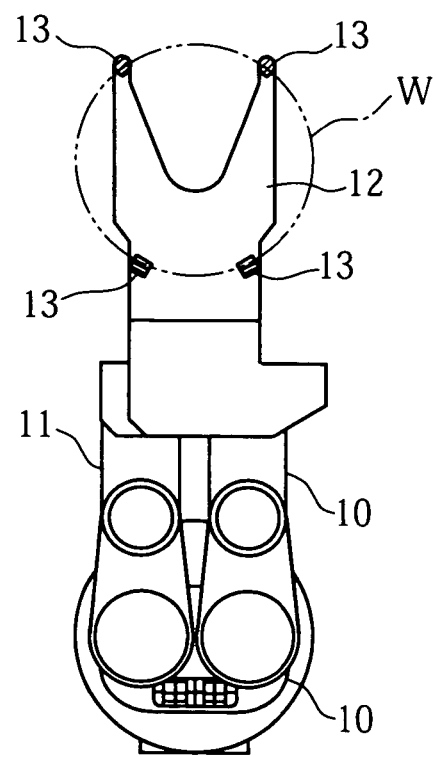
FIG. 16 is a plan view of the conventional transfer robot, with both hands extended.
Figure 17:
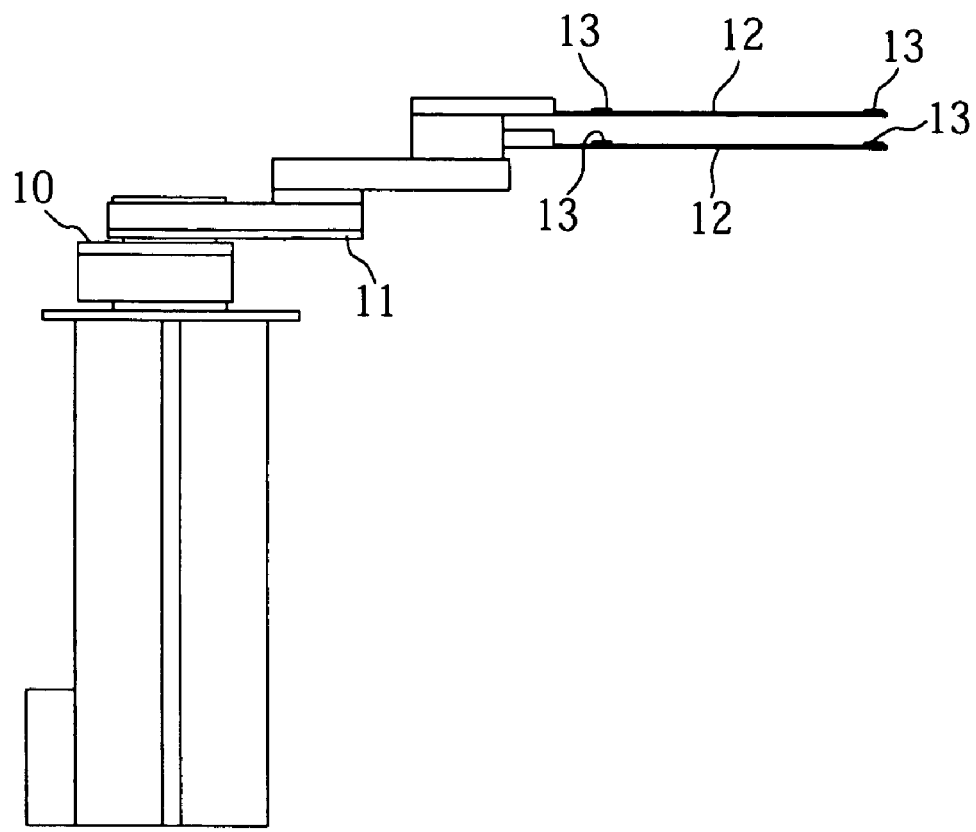
FIG. 17 is a side view of the conventional transfer robot, with both hands extended.
Figure 18:
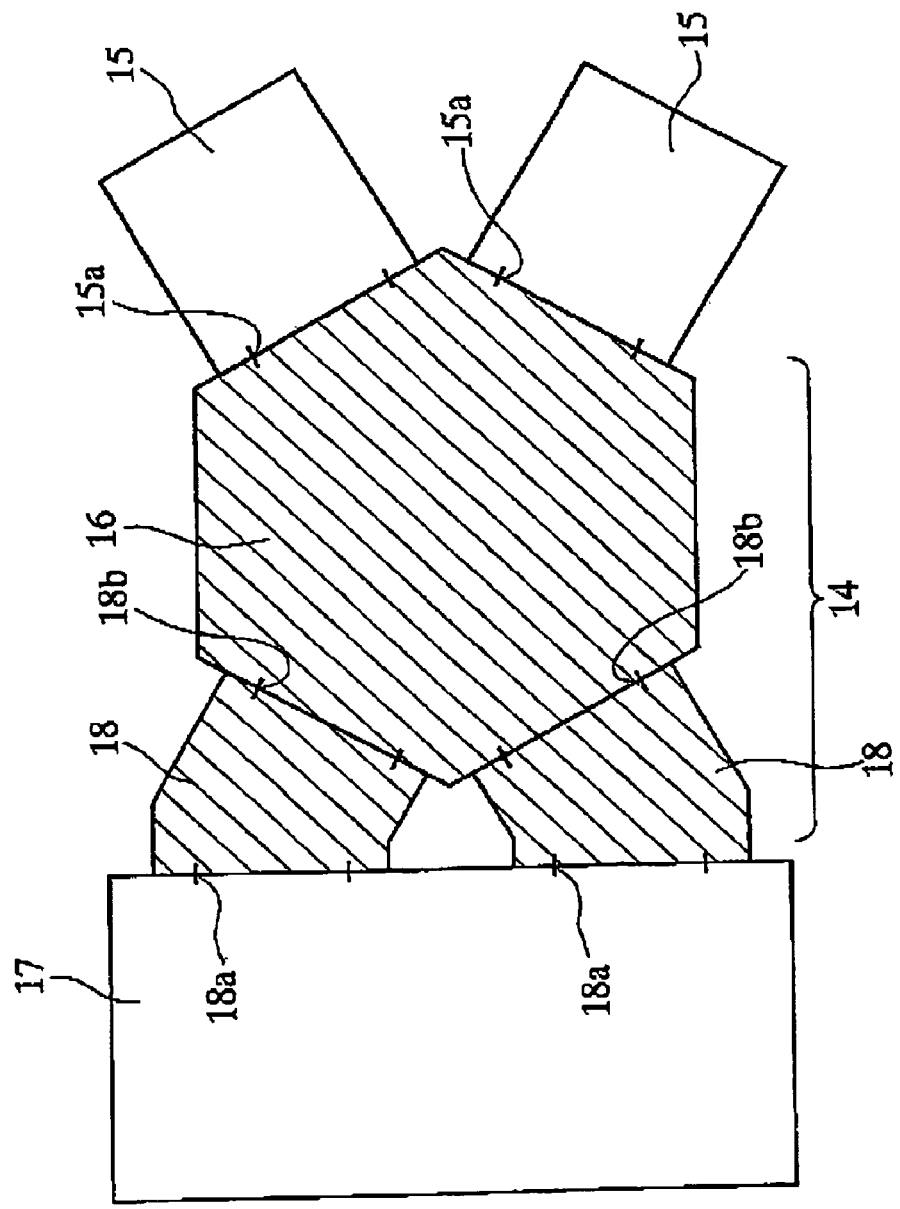
FIG. 18 is a plan view, showing a vacuum transport module utilized in manufacture of semiconductors.

FIG. 14 is a schematic diagram showing a hand 300 of a different construction which can replace the hands 300A, 300B as used in the above embodiments. This hand 300 includes a front portion provided with stoppers 312 which are elastically displaceable by leaf springs 330. In this embodiment, each stopper 312 is formed in a block member 310 which includes a work holding table 311, and the entire block member 310 is supported via the leaf spring 330. The hand 300 has a rear edge provided with two block members 320 as in the hands 300A, 300B in the previous embodiments, as well as a U-shaped cutout 331 for a work holder 400 to come in.

The work holder 400 is provided in the swivel base 110 on the other hand so as to contact a rear edge of the work W held on the hand 300. The work holder 400 may elastically retract via a leaf spring 410 as in the first embodiment, or may be fixed.

With this arrangement, when the hand 300 retracts with the work W held thereon, the work holder 400 finally comes into contact with a rear edge of the work W. Under this state, front block members 310 make elastic forward displacement due to the leaf spring 330, thereby reducing impact from the work holder 400. The work W is elastically clamped between the stoppers 312 of the block members 310 at the front, and the work holder 400 at the rear. Therefore, the same advantages as offered in the first embodiment are enjoyed; e.g. even if the swivel base 110 is pivoted quickly when the hand 300 is in the retracted position, the work W is not centrifugally spun out.

Obviously, the scope of the present invention is not limited by the embodiments, and all variations within the scope of claims are included in the present invention.

In particular, the linear transfer mechanisms 200A, 200B may be varied in different ways. For instance, two sets of parallelogram link mechanisms may be connected to each other, and by deforming these parallelogram link mechanisms in a predetermined patterns, the hand holder may be moved on a linear path while maintaining a predetermined orientation. Another alternative may be that the hand holder is supported by a linear guide, with the hand holder connected to an appropriate place of an endless belt.

Further, the description so far assumes the use in a vacuum environment, yet the transfer robot according to the present invention may also be used under an atmospheric environment.

The invention claimed is:

1. A transfer robot comprising:
   a swivel base pivotable about a vertical axis;
   a hand for holding a plate-like work placed thereon; and
   a linear transfer mechanism supporting the hand and provided on the swivel base, the transfer mechanism designed to move the hand forward and backward along a horizontal linear path;
   wherein the hand is provided with a front stopper for checking a front edge of the work;
   wherein the swivel base is provided with a work holder contacting a rear edge of the work when the hand is moved to a retracted position on the linear path;
   wherein the transfer robot further comprises an upright leaf spring having an upper end and a lower end; and
   wherein the upper end is connected to the work holder, the lower end being connected to the swivel base, the leaf spring having a longitudinal axis, as viewed in horizontal cross section, that is perpendicular to the linear path of the hand.

2. The transfer robot according to claim 1, wherein the stopper on the hand is fixed to the hand in a nonmovable manner.

3. The transfer robot according to claim 1, wherein the hand is provided with a stationary rear stopper for checking a rear edge of the work.

4. The transfer robot according to claim 3, wherein the rear stopper comprises two stopping members spaced from each other in a width direction of the hand, wherein the hand is formed with a cutout between the two stopping members for allowing entry of the work holder.

5. The transfer robot according to claim 1, therein the hand is configured to hold a circular plate-like work.

6. The transfer robot according to claim 1, further comprising a second set similar to a first set made up of the linear transfer mechanism, the hand, the stopper and the work holder, wherein the first set and the second set are point-symmetrical with respect to the swivel axis, and wherein the linear path of the hand in the first set and the linear path of the hand in the second set are in line.

7. A transfer robot comprising:
   a swivel base pivotable about a vertical axis;
   a hand for holding a plate-like work placed thereon; and
   a linear transfer mechanism supporting the hand and provided on the swivel base, the transfer mechanism designed to move the hand forward and backward along a horizontal linear path;
   wherein the hand is provided with a front stopper for checking a front edge of the work;
   wherein the swivel base is provided with a work holder contacting a rear edge of the work when the hand is moved to a retracted position of the linear path;
   wherein the hand is provided with a stationary rear stopper for checking a rear edge of the work;
   wherein the rear stopper comprises two stopping members spaced from each other in a width direction of the hand; and
   wherein the hand is formed with a cutout between the two stopping members for allowing entry of the work holder.

8. The transfer robot according to claim 7, wherein the stopper on the hand is fixed to the hand in a nonmovable manner.

9. The transfer robot according to claim 7, wherein the hand is configured to hold a circular plate-like work.

10. The transfer robot according to claim 7, further comprising a second set similar to a first set made up of the linear transfer mechanism, the hand, the stopper and the work holder, wherein the first set and the second set are point-symmetrical with respect to the swivel axis, and wherein the linear path of the hand in the first set and the linear path of the hand in the second set are in line.

* * * * *